US007518225B2

(12) United States Patent  
Emma et al.

(10) Patent No.: US 7,518,225 B2  
(45) Date of Patent: Apr. 14, 2009

(54) CHIP SYSTEM ARCHITECTURE FOR PERFORMANCE ENHANCEMENT, POWER REDUCTION AND COST REDUCTION

(75) Inventors: Philip G. Emma, Danbury, CT (US); John U. Knickerbocker, Monroe, NY (US); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 11/538,567

(22) Filed: Oct. 4, 2006

(65) Prior Publication Data

US 2007/0290315 A1    Dec. 20, 2007

Related U.S. Application Data

(63) Continuation-in-part of application No. 11/453,885, filed on Jun. 16, 2006.

(51) Int. Cl.
*H01L 23/02* (2006.01)
(52) U.S. Cl. ........................................ 257/686; 257/723
(58) Field of Classification Search ................ 257/686, 257/693, 700, 723
See application file for complete search history.

(56) References Cited

U.S. PATENT DOCUMENTS 5,702,984 A * 12/1997 Bertin et al. .................. 438/15
7,217,994 B2 * 5/2007 Zhu et al. .................... 257/686

* cited by examiner

*Primary Examiner*—Roy K Potter
(74) *Attorney, Agent, or Firm*—Mark Wardas; Jon A. Gibbons; Fleit Gibbons Gutman Bongini & Bianco P.C.

(57) ABSTRACT

A computer chip is structured to have at least one single-layered chip, at least one multi-layered chip stack, and a carrier package characterized by electrical interconnections of less than 100 microns diameter, wherein the single-layered chip and the multi-layered chip stack are each electrically coupled to the electrical interconnections of the carrier package, and the single-layered chip is communicatively coupled to the multi-layered chip stack through the carrier package so that an electrical signal propagates over a given distance between the single-layered chip and the multi-layered chip stack at substantially a speed of propagation for a single layer chip over the given distance. The single-layered chip can be a processor having multi-cores and the multi-layered chip stack can be a memory cache stack. Interconnect vias, having a density at least as great as 2500 interconnects/cm² electrically couple the single-layered chip and the multi-layered chip stack to the carrier package.

18 Claims, 9 Drawing Sheets

CHIP SYSTEM ARCHITECTURE FOR PERFORMANCE ENHANCEMENT, POWER REDUCTION AND COST REDUCTION

CROSS-REFERENCE TO RELATED APPLICATIONS

This application is a continuation-in-part from prior U.S. patent application Ser. No. 11/453,885, entitled "METHOD FOR ACHIEVING VERY HIGH BANDWIDTH BETWEEN THE LEVELS OF A CACHE HIERARCHY IN 3-DIMENSIONAL STRUCTURES, AND A 3-DIMENSIONAL STRUCTURE RESULTING THEREFROM," filed on Jun. 16, 2006 the entire disclosure of which is herein incorporated by reference.

BACKGROUND OF THE INVENTION

1. Field of the Invention

This invention generally relates to a method for designing multi-core processing systems, and more specifically, to a method for combining two emerging technology areas: Systems On Package (SOP) and 3D technology.

2. Description of Related Art

As circuit density has scaled in accordance with Moore's Law, single chips have grown to contain more and more of a computer system. Two decades ago, it was a revelation that an entire processor could fit on a single chip. When the CMOS node reached the 180 nanometer level, technology had evolved to the point that not only was the processor's Level-1 cache (L1) contained on the same chip with the processor, but for the first time, it was also feasible to include the next level of cache, L2. About a decade ago, the first single-chip multiprocessors were produced.

In 2001, IBM started shipping the first dual core chips. Presently, as chip processing capabilities head toward the 65 nanometer, and then 45 nanometer nodes, most companies intend to ship 4 or 8 cores—and perhaps more—on a single chip. As technology dimensions continue to shrink, and as more cores are being put on a chip in the multi-Ghz regime, three significant things are happening.

First, the cores themselves are getting physically much smaller and are taking up less of the area on the chip. Second, as more compute power is put into a chip, much more cache capacity is required to hold the data (being computed upon) for that compute power to be useful. Thus the on-chip caches are getting larger. Finally, at higher frequencies, in order for the chip to run fast, the first-level (L1) caches are becoming too small, so more levels are being inserted into the cache hierarchy. In other words, each core now has a private cache hierarchy before these hierarchies feed into a shared level of cache.

FIG. 1 illustrates the above situation. On the left are a "core" 100, which comprises the processor 101 itself, and two additional cache levels 103, 104. The processor 101 is the logic-intensive circuitry. The L1 cache 102 is considered to be part of the processor 101, since its access is part of the processor pipeline. As frequencies have gone up to multiple Ghz, the L1 102 has become too small to provide high hit rates. Therefore, an L1.5 103 cache level has been added to supplement the L1 102. The L1.5 103 is also limited in size because it must be reasonably fast to accommodate the high miss rate from the L1 102. Therefore there is an L2 104 is required. Note that most of what is called a "core" 100 is actually memory. When multiple cores 100 are aggregated into a single "multi-core chip" 105, the chip is large, but most of it is memory.

FIG. 2 illustrates today's prior art technology for multi-core chips. The multi-core chip 105 is mounted on a Dual-Chip Module (DCM) 200, which can either be ceramic or organic, where it is connected to another chip shown as L3 201. In fact, what is shown as L3 201 usually contains not only another layer of cache, but also other functions that facilitate the operation of the nest (not shown) (i.e. all system functions excluding the processor, cache, and memory; such as external memory, I/O controllers, wiring, PC boards, etc.), and functions that connect the DCM 200 to other devices in the system.

To make a 16-way processor system, four of these DCMs 200, are mounted with another layer of packaging 202 (and/or other interconnection means), as shown. Alternatively, the four 4-core chips could be put together on a 4-chip module (not shown), and connected to other layers of cache put off module.

There are many ways of making this 16-way processor system 203 with standard packaging. All require several layers of packaging, and wind up having a fairly large footprint. To make larger chips, this progression continues. For example, a 64-way system can be made out of four 16-way systems 203 (e.g. probably four boards in a chassis); a 256-way system by placing four chassis into a frame; multiple frames in a room, etc.

Within the last decade, Systems On Package (SOP) has emerged as a promising technology for integrating multiple chips into a system "package" in a manner that made these multiple chips behave as a single, monolithic chip. In particular, when the package is actually a silicon wafer and the solder balls connecting the component chips to the package are sufficiently tiny, with a sufficiently small pitch (e.g., less than 20 microns), then for all practical purposes, the aggregation appears, at least electrically, to be a single chip.

This effect occurs because the wiring on the silicon wafer, henceforth called a Silicon Carrier (SC), can be identical (in materials, pitch, and electrical characteristics) to the wiring on the component chips. With a dense enough interconnect pitch and sufficiently small solder balls, a "chip-to-chip" electrical signal that propagates across a SC appears to be very much the same as any other electrical signal propagating across a single, larger chip at a similar distance. In fact, because the SC is purely a wiring vehicle and not subject to the blockages encountered on a normal chip, wiring can be shielded much more easily, resulting in better electrical characteristics.

When the interconnect pitch is less than 20 microns, millions of signals can be "escaped" to the package from a typical chip. Generally, when signals are "escaped," special off-chip drivers, receivers, and several metal layers are required to perform a spatial transformation of the signal. However, with a SC, no additional devices are necessary because the wiring on the SC is the same as the wiring on the chips that it contains. In other words, a signal is not affected by transferring from one chip to another chip.

Thus, SC technology appears to offer many advantages. It allows several chips to be connected together to operate as a single, larger chip. The resulting chip system is larger than the theoretical size of any real chip, but because the chip is partitioned into smaller pieces, the effective yield is higher.

Using SC technology, the system of FIG. 2 can be implemented more efficiently and much denser. The advantage of making this denser is that more processors and cache can be aggregated into a subsystem, which allows a larger system (in number of processors) to be implemented in a given volume. Further, operation at much reduced power is possible using this densely integrated solution compared to no integration with chip stacks and silicon carrier due to power savings such as voltage reduction, reduced RC (because of reduced line length, size in chip stacks, and between chips on a silicon carrier), and lower noise.

For example, FIG. 3 depicts two ways in which we could make a 16-way system 301, 302 using the 4-core chips 105 of FIG. 1 and some L3 chips 201. Shown in the top left corner, four of these 4-way chips 105 are assembled together on a large SC to make a 16-way chip 300. To make a system, the 16-way SC "chip" 300 is combined with some L3 chips 201 using standard packaging as shown on the right 301. Alternately, four of the 4-way chips 105 are combined with L3 chips 201 on a huge SC 302 to implement the entire system in one step.

This later implementation 302 requires fewer levels of packaging, has shorter wires (hence lower power—and perhaps wider paths) between the elements, and it results in a smaller footprint. However, the SC is much larger in 302, and the power density is higher. Which of these implementations (301 or 302) is "better" depends on the characteristic being optimized. At this level of abstraction, it is impossible to say which of these is cheaper by the time that the entire system is put together.

Even more recently, new developments have demonstrated the viability of interconnecting two or more planes of circuits by thinning those planes to a few hundred microns or less, etching dense via patterns in them, and then interconnecting them with metalization processes. The resulting structure is a monolithic "chip" comprised of multiple planes of circuits. This recent advance is provides a new dimension in the scaling of circuit density, as is hereafter referred to as "3D."

Thus, 3D and SC seem to offer many of the same advantages. Each technology enables multiple chips to be integrated into a larger, monolithic entity, appearing as if it were a much larger chip. However, it should be noted that in 3D, if circuits on the component chips can be arranged such that most of the required interconnections between them are directly over (or under) each other, then the interconnection wiring is much shorter than for SC. Most logic circuitry cannot generally be arranged in this way, however this arrangement can work well for memory circuits. For example, U.S. patent application Ser. No. 11/453,885, entitled "METHOD FOR ACHIEVING VERY HIGH BANDWIDTH BETWEEN THE LEVELS OF A CACHE HIERARCHY IN 3-DIMENSIONAL STRUCTURES, AND A 3-DIMENSIONAL STRUCTURE RESULTING THEREFROM," filed on Jun. 16, 2006, teaches one method of constructing a cache hierarchy be leveraging 3D technology that offers unprecedented amounts of bandwidth between the layers at very low power, which is hereby incorporated by reference in its entirety.

FIG. 4 illustrates a system built using 3D stack technology only, as described in U.S. patent application Ser. No. 11/453,885, which is hereby incorporated by reference in its entirety. That prior art capitalizes on the enormous bandwidth that 3D offers in going between the levels of a cache hierarchy if the bits within the respective caches were placed according to a certain method. Therefore, to take advantage of that bandwidth opportunity, that prior art split out the L1.5s 103 and L2s 104 as separate chips that stacked on top of each other.

Instead of the four-core chips 105, the L2s 104 are removed, and a new chip 401 is assembled comprising only processors 101 and L1.5s 103 covering the same area as the prior 4-core component 105. In FIG. 4, the new chip 401 contains twelve cores 101 with their corresponding L1.5s 103. Assembling layers of L2s 102 and L3s 201 into new chips 402, having the same footprint as the new twelve-core chip 401, create a cache hierarchy. Then these chips 401 and 402 are stacked up to make a twelve-core system 403.

The advantages of this new system 403 are:
1. A complete 12-way system now has the same footprint as the old 4-way chip, which is just a subsystem. That is, the single-socket 12-way system does not require any more intermediate packaging layers.
2. Depending on the number of chips stacked, there is a potential for including considerably more cache than would have had the area for in standard packaging.
3. The busses between the levels of the cache hierarchy can be extremely wide, and extremely short, offering unprecedented amounts of bandwidth at low power.

However, certain limitations of this system may limit the range of product solutions:
1. The total capacity of the cache is limited by the amount of layer that can reasonably be stacked in the chips.
2. There is a potential for a greater power density than can dispensed using conventional cooling.
3. The thermal resistance is increased when the stacks are high, further complicating the cooling.
4. Every layer must be designed and built for the entire chip stack to function, leading to longer development times and costs for mask levels and integration.

Neither SC nor 3D solutions completely resolve the problems encountered when attempting to manufacture multi-core processors in ever-greater densities. Therefore a need exists to overcome the problems with the prior art as discussed above.

SUMMARY OF THE INVENTION

According to a preferred embodiment of the present invention, a computer chip structure and computer system have at least one single-layered chip, at least one multi-layered chip stack, and a carrier package, characterized by electrical interconnections of less than 100 microns diameter, where the single-layered chip and the multi-layered chip stack are each electrically coupled to the electrical interconnections of the carrier package, and the single-layered chip is communicatively coupled to the multi-layered chip stack through the carrier package so that an electrical signal propagates over a given distance between the single-layered chip and the multi-layered chip stack at substantially a speed of propagation for a single layer chip over the given distance.

In one embodiment, the single-layered chip is a processor, having single or multiple cores, and the multi-layered chip is a memory cache stack.

At least one of the single-layered chip and the multi-layered chip stack is electrically coupled to the carrier package by interconnect vias. The interconnect vias have a density that is as least as great as two thousand five hundred interconnections per square centimeter (2500 interconnections/cm$^2$).

In one embodiment, the carrier package also contains a plurality of integrated decoupling capacitors, each coupling capacitor physically positioned directly under an interconnect via on the side of the carrier package opposite the side the single-layered chip and the multi-layered chip stack are electrically coupled thereto.

Power is delivered to the single-layered chip by means of integrated decoupling capacitors located directly under an interconnect via of the single-layered chip, and delivered to the multi-layered chip stack by means of integrated decoupling capacitors located directly under an interconnect via of the multi-layered chip stack.

The interconnect vias are created by means of silicon through vias, electrical interconnections, thermal vias, thermal interconnections, or thermal interface materials. The carrier package is made of silicon, organic materials with build up layers, organic materials without build up layers, organic materials with fiber reinforcement, or organic materials without fiber reinforcement.

In one embodiment, the carrier package has a first surface plane and a second surface plane opposing the first surface plane, and the single-layered chip and the multi-layered chip stack are physically positioned on the same surface plane of the carrier package. Also, the computer chip structure has a first cooling structure thermally coupled to a top-side of the single-layered chip, and a second cooling structure thermally coupled to a bottom-side of the multi-layered chip stack, providing at least two independent thermal paths. Each thermal path is created by means of at least one of electrical vias, electrical interconnections, thermal vias, thermal interconnections, and thermal interface materials.

In another embodiment, the carrier package has a first surface plane and a second surface plane opposing the first surface plane, and the single-layered chip and the multi-layered chip stack are physically positioned on opposing surface planes of the carrier package such that horizontal wiring distances in intra-level busses are minimized.

In another embodiment, the computer chip structure contains a second carrier package electrically coupled to at least one multi-layered chip stack by interconnect vias. The second carrier package is thermally coupled to the multi-layered chip stack for providing a second, independent path for heat dissipation.

In another embodiment, the computer chip structure contains a plurality of multi-layered chip stacks and a carrier package characterized by electrical interconnections of less than 100 microns diameter, wherein the multi-layered chip stacks are each electrically coupled to the electrical interconnections of the carrier package, and communicatively coupled to at least one other multi-layered chip stack through the carrier package so that an electrical signal propagates over a given distance between the multi-layered chip stacks at substantially a speed of propagation for a single layer chip over the given distance.

BRIEF DESCRIPTION OF THE DRAWINGS

In the accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DESCRIPTION OF THE PREFERRED EMBODIMENTS

Terminology Overview

Figure 1:
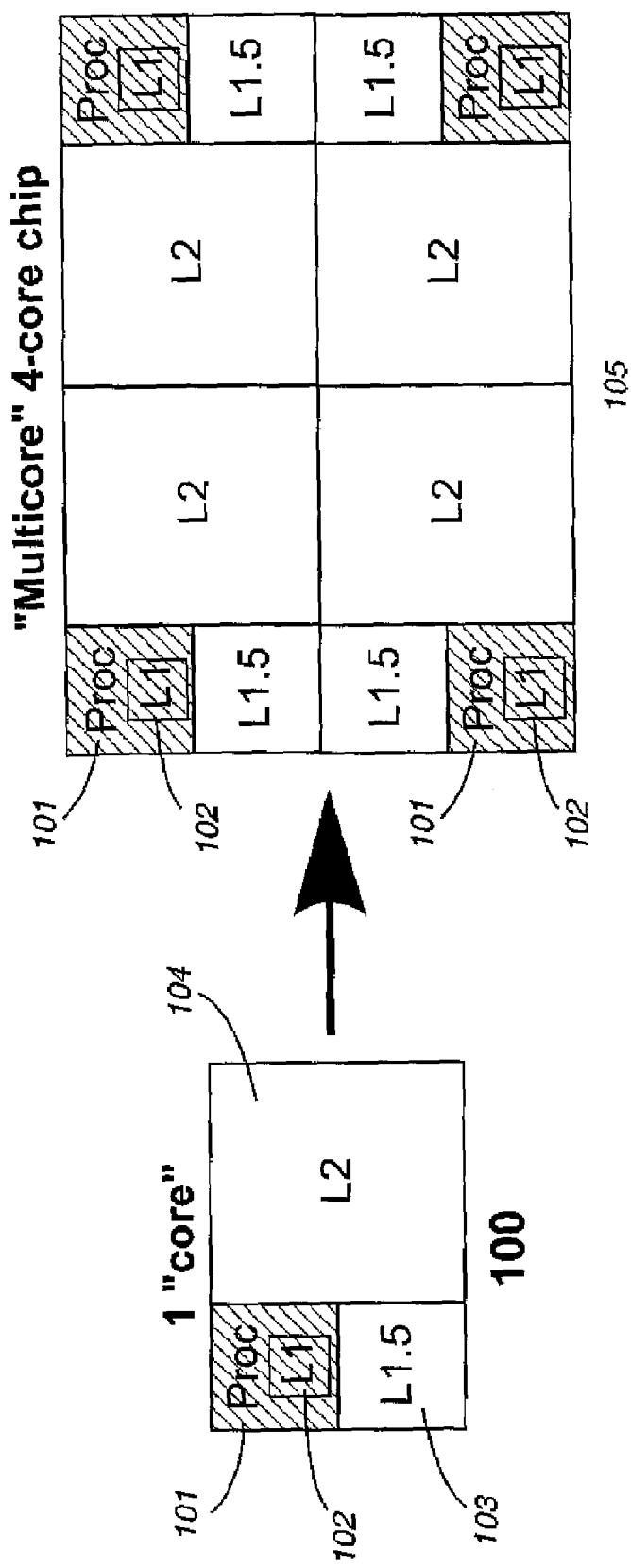
FIG. 1 is a block diagram illustrating a prior art single core with its cache hierarchy, and a prior art multi-core chip.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an," as used herein, are defined as "one or more than one." The term "plurality," as used herein, is defined as "two or more than two." The term "another," as used herein, is defined as "at least a second or more." The terms "including" and/or "having," as used herein, are defined as "comprising" (i.e., open language). The term "coupled," as used herein, is defined as "connected, although not necessarily directly, and not necessarily mechanically." The terms "controls," "button," "knob," and "switch" are used interchangeably to indicate a mechanical means for a user to control functions of a piece of equipment instrument or device. The terms "program," "software application," and the like as used herein, are defined as "a sequence of instructions designed for execution on a computer system." A program, computer program, or software application typically includes a subroutine, a function, a procedure, an object method, an object implementation, an executable application, an applet, a servlet, a source code, an object code, a shared library/dynamic load library and/or other sequence of instructions designed for execution on a computer system.

Overview

The present invention, according to one embodiment, overcomes problems with the prior art by positioning a new system structure that combines 3D and SC technologies as mutually synergistic technologies instead of viewing these technologies as mutually competing technologies. The strengths of each technology are used to compensate for the other's weakness. In this way, a system is constructed that is far beyond the scale of what could be done with either technology by itself Although 3D and SC appear to be "competing" technologies in that they take different approaches toward achieving a similar goal (i.e. aggregating multiple chips into one), there are a few, subtle differences. The three greatest differences are:

1. In the case that circuitry is arranged such that the required interconnections are directly "over and under" each other, the resulting busses in 3D will be on the scale of a millimeter (i.e. principally be in the vertical stack), hence they can be very fast and relatively low power. In SC, the same busses will be on the scale of a centimeter, and will not be as fast or as efficient.
2. With SC, all of the chips that are to be interconnected must be arranged in a plane. Therefore, if there are many chips (such as with memory systems), the footprint of the aggregations will be very large. This can be a very inefficient use of space on the next-level package. Further, there are limits to how large the SC can be made in a cost-effective way. Thus, only the number of component chips that fit within that limit can reasonably be integrated.
3. In 3D, when more than a few planes are piled up into a stack, the total power density can become too high and lead to challenges both with power delivery into the stack and cooling of all chips in the stack, especially if using low cost standard cooling methods. Concurrently, the thermal resistance grows with the stack height, compounding this problem. This is particularly problematic when the entire system—including processors—is in the stack where often a processor may be a high power density chip and require significant cooling for many applications.

An embodiment of the present invention offers two major improvements over the prior art. First, all cache levels that are typically located outside the processor (i.e. all cache levels greater than L1) are removed from the processor chip. This allows the logic chip containing the cores to be more logically dense than ever before realized.

One constant source of problems with manufacturing multi-chip processor systems that integrate logic circuits (processors) with large caches is that low-yield components are combined with memory to make a large chip. The processor cores lack the simple redundancy possible with memories, resulting in low-yield problems. The combination of processors and memory increases the risk associated with production yield and therefore makes the system costly. By removing all of the cache, the entire area of the chip is consumed exclusively by cores. This lowers yield loss because redundancy is accomplished by the simple addition of a few extra cores without adding all of the area that their caches would have required.

A second improvement over prior art is that neither the power density nor the thermal resistance is increased to the hottest component—the processor chip. This allows the cores to operate in a higher power regime, if desired, achieving a higher performance by providing area array power feeds to the processor and area array cooling to the opposite side of the processor chip without the need to remove heat from the processor chip, through other chips in a stack, to a heat sink.

In the prior art 12-core system 403, created using 3D technology, the logic density is increased significantly by segregating the core processors 101 and level L1.5 memory cache 103 from higher cache levels in the hierarchy. The resulting 12-core chip 401 is designed to share an identical footprint as each layer of cache memory 102, 201 to enable vertical stacking of layers.

Figure 5:
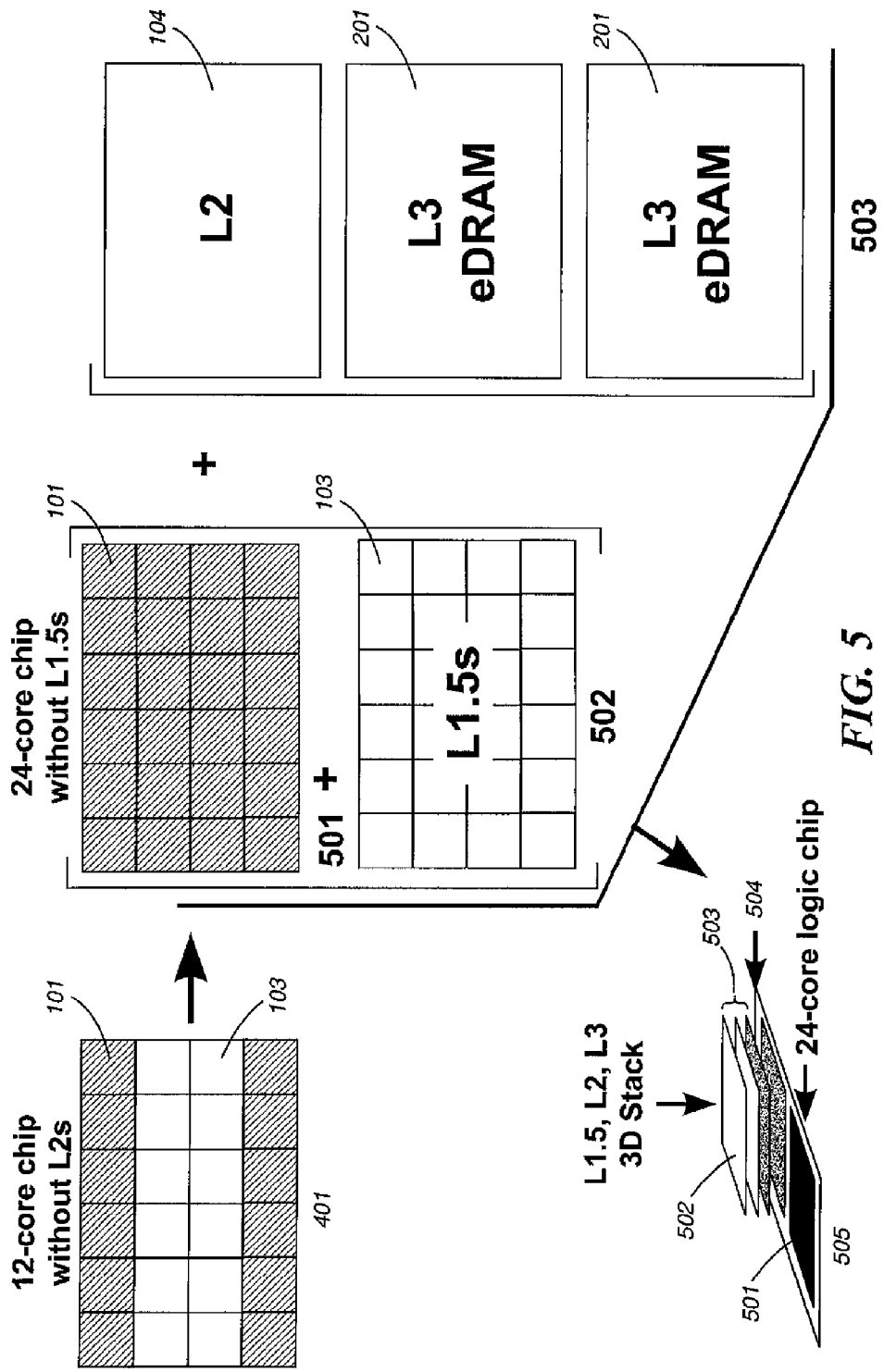
FIG. 5 is a block diagram illustrating an exemplary 24-way single-socket processor system in accordance with one embodiment of the present invention using a combination of both SC and 3D technologies.

An exemplary embodiment of the present invention, shown in FIG. 5, builds on this concept by further removing the L1.5 memories 103 from the 12-core chip 401, and filling in the area vacated by the L1.5s 103 with additional cores 101. This results in a 24-core all-logic chip 501, which has the same area as the original 12-core chip 401. Next, a new chip layer 502 is created containing only L1.5 memory 103.

Additional L2 104 and L3 201 chips are assembled using complementary 3D & SC technologies. For example, a 3D stack 503 of all of the memory caches (L1.5, L2, and L3) is produced and mounted adjacent to the 24-core logic chip 501 on a carrier package 504. Interconnections connecting the component chips 501, 503 to the package 504 have a pitch less than 100 microns, meaning an interconnect density of greater than two thousand five hundred interconnects per square centimeter ($2500/cm^2$). The data bus between the 24-core layer 502 and the cache stack 503 is routed through the carrier package 504. This results in a single socket 24-way complete system 505.

Figure 6:
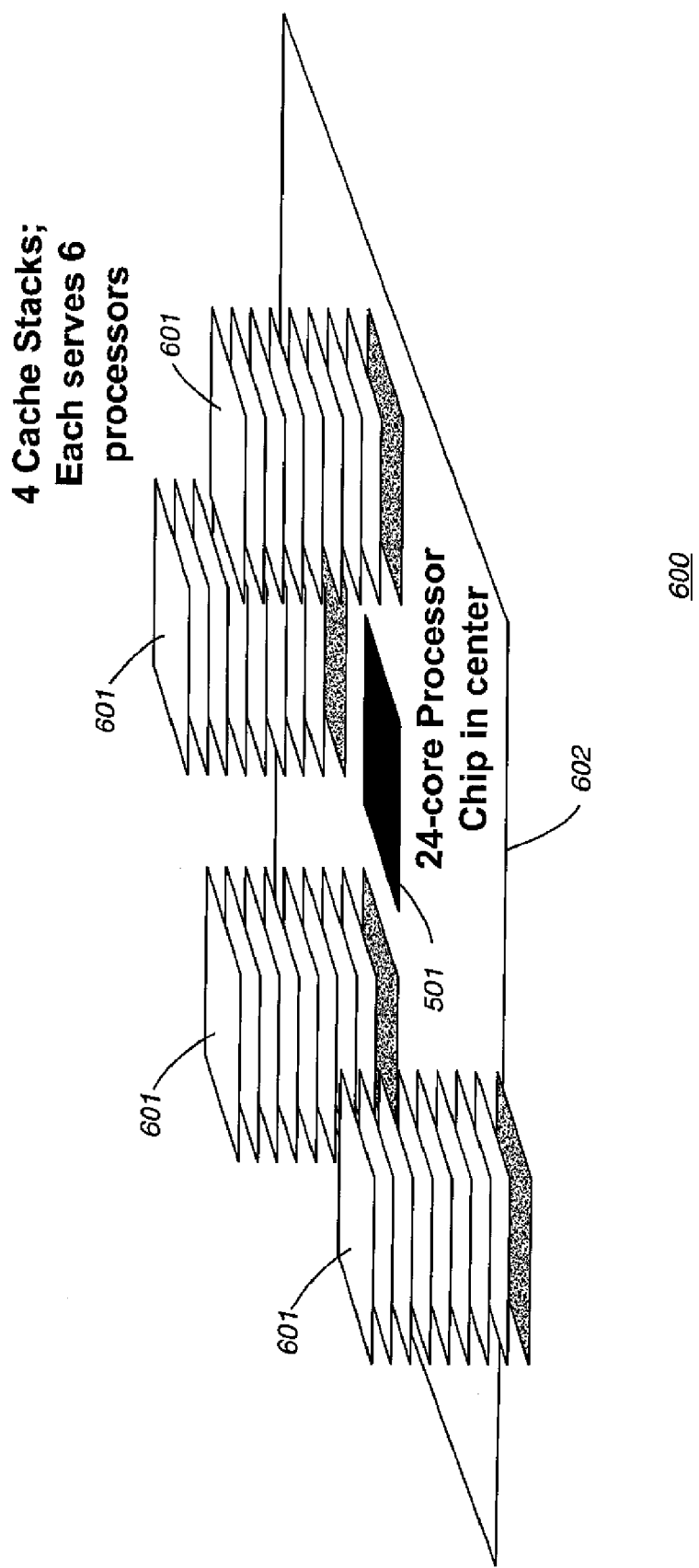
FIG. 6 is a block diagram illustrating an exemplary 24-way processor system having enormous caches contained in multiple, vertical towers, by partitioning the system in accordance with one embodiment of the present invention.

Note that in canonical thinking, it seems disadvantageous to put an all-L1.5 chip 502 adjacent to the all-core chip 501 because some of the cores 101 will be located a great distance from their respective L1.5s 103, requiring long routes for data signal propagation. However, there are two mitigating factors. First, depending on the areas involved and the number of L1.5 layers 502 implemented, the performance lost due to these potential added cycles of delay can be mitigated by increasing the capacity of the L1.5s 502, which reduces their miss rates. Secondly, the cache stacks 503 can be broken into multiple stacks, and positioned along all of the edges of the processor chip to reduce this distance. FIG. 6 illustrates one manner in which multiple cache stacks 601 are positioned. Here, the 24-core logic chip 501 is located in the center of the carrier package 602, with four cache stacks 601 positioned around it. Note that in this example, each cache stack 601 serves just six of the twenty-four processors 101. If each of these cache stacks 601 has a footprint comparable to the original chip stack 503, then the L1.5s 502 can be much bigger, since the footprint of the chip need only accommodate six of them. Thus, the electrical signal actually propagates over a given distance between the multi-core processor and the multi-layered memory cache stack at substantially a speed of propagation for a single layer chip over the given distance. (At this point, it should be noted that the processor chip 501 and cache stacks 601, as depicted in FIG. 6, are not drawn to scale, but merely enhanced to illustrate a concept of the present invention. The layers of each cache stack 601 are actually thinned down to a point where the height of the resulting cache stacks 601 are equivalent to the height of the processor chip 501 for easy manufacturability.)

Thus, to those skilled in the art, it will initially appear counterintuitive to move the L1.5s 103 away from their corresponding processors 101, but the use of SC allows a very wide bus with high-speed shielded signals, and the 3D technology dramatically increases the L1.5 capacity. Further, this procedure allows more processors to fit on the same logic chip. Therefore, while breaking these two components apart may seem unnatural to those skilled in the art, the act of doing so more than compensates in other ways.

Although, in the above embodiment, the cache stack is the entire hierarchy beyond the L1, with some horizontal wiring required across the SC to reach the L1.5, it should be understood that this need not be the exclusive manner of partitioning. For example, if the power density of the processor chip is not unwieldy, the L1.5 layer 502 is stacked upon the processor chip 501, and the cache towers 503 begin with the L2 level.

A highly desirable feature of FIG. 6 is that additional cache capacity is accomplished in three ways. First, since there are four cache towers 601, instead of the single tower 503 shown in FIG. 5, the cache capacity is at least quadrupled. Second, since the hottest component—the processors 101—have been removed from the towers 601, the stacks are able to be stacked higher because there is less power density. Thus, the capacity is further increased by factor of two or more from the increased stack height. Third, it should be noticed that in FIG. 6, the four corners of the SC 602 are empty. Additional towers 601 can be placed in the corners of the SC 602 (e.g., doubling the amount of cache), or other functions, such as I/O channels, optical transceivers, or any other desired functions can be located in these corners.

A single socket system, built using SC and 3D in conjunction, has many more processors and much more cache memory than could be put together otherwise. More surprisingly, while the total power consumption of all of the added processors and cache is greater because of the increased number of integrated components, the power density is less than that of the smaller capacity prior-art system when partitioned in the manner set forth above. This is accomplished by physically isolating the high-powered processors from lower-powered memory components. The low-powered memory stacks (SRAM and DRAM) are then multiplied and built even higher than before possible. The connections between the processors and the cache towers are very broad, enabling an extraordinarily powerful socket with a reasonably small footprint.

Figure 7:
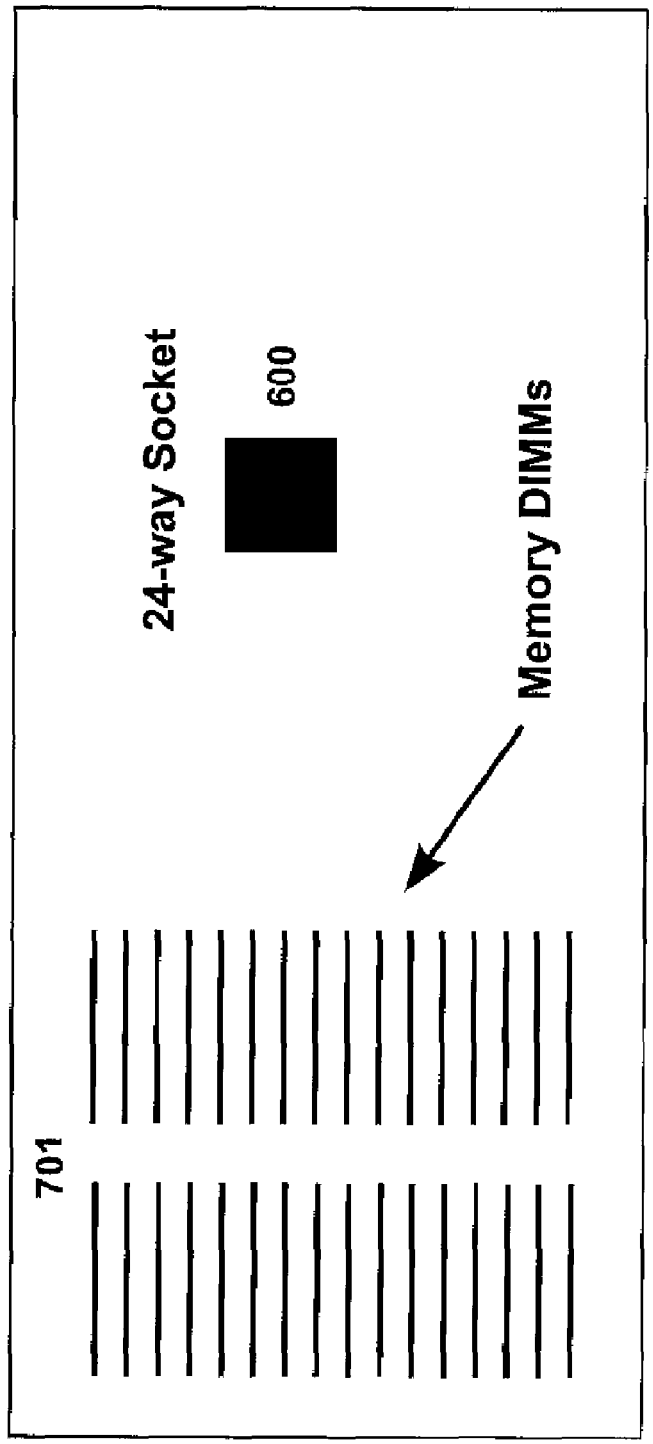
FIG. 7 is a block diagram highlighting the simplicity of an exemplary system board when the multiprocessor is socketed in a manner set forth by an embodiment of the present invention.

Additionally, the larger, more powerful system processor further simplifies the rest of the computer system and changes the value proposition on a motherboard. For example, as shown in FIG. 7, a 24-processor 6 is placed onto a single board 700. Note that the 24-way system 600 of FIG. 6 appears as a single component 600 on the board 700. The only other components on this board 600 is the memory system 701, comprising only a couple of columns of DIMMs 701. Since there is only a single component 600 (besides the DIMMs) on the board 700, the board wiring should be extremely simple, and the board itself cheap.

Figure 8:
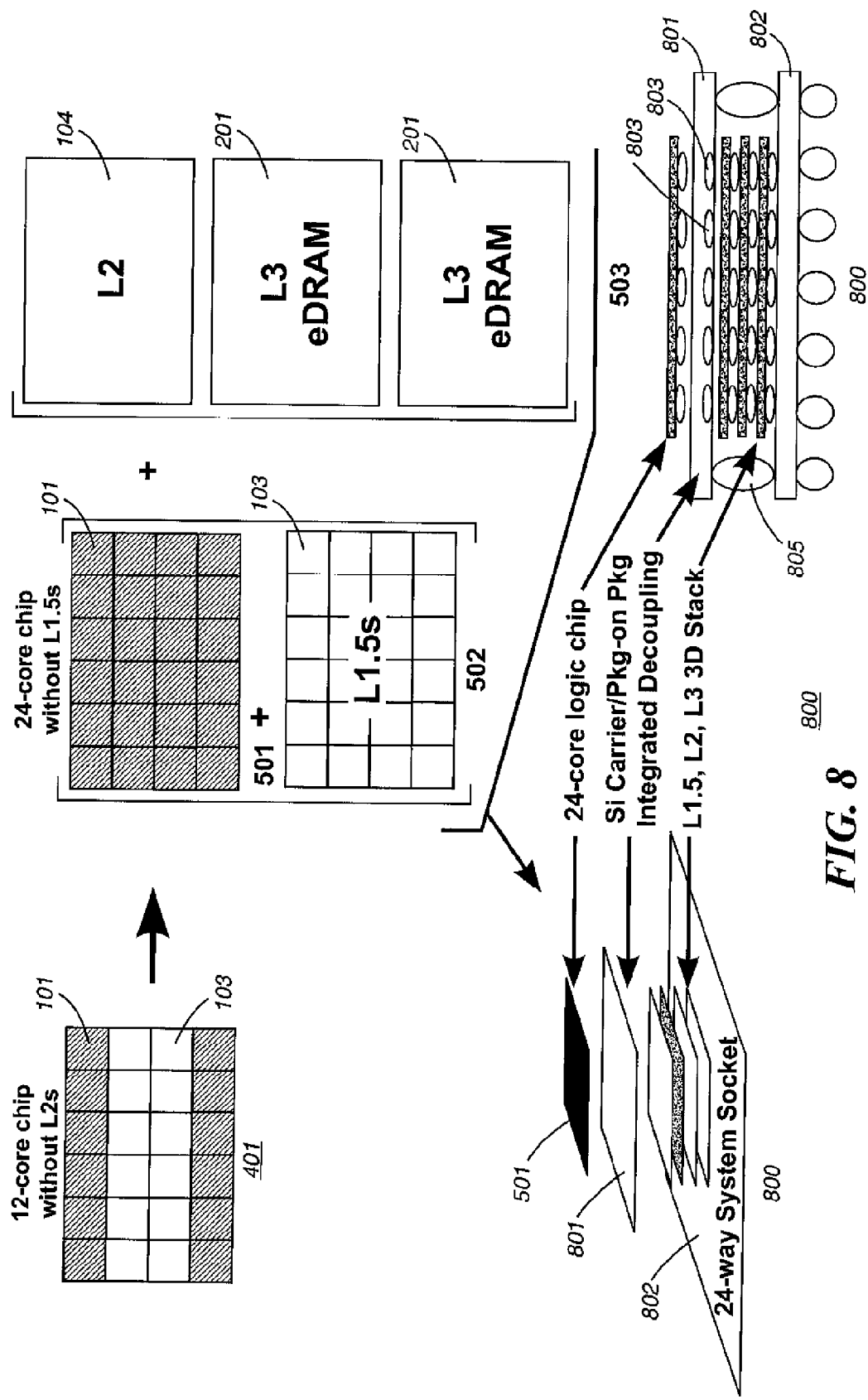
FIG. 8 is a block diagram illustrating an exemplary 24-way single-socket processor system in accordance with another embodiment of the present invention using a combination of both SC and 3D technologies.

FIG. 8 illustrates another embodiment of the present invention using Package-on-Package techniques for vertical 3D integration. In this embodiment, a 24-core logic chip 501, containing only the processor cores 101 and L1 memory 103 is assembled in the same manner as shown in FIG. 5. However, the 24-core logic chip 501 is then mounted on its own silicon carrier 801. The memory cache 503 is combined with the L1.5 memory layer 502 using 3D technology and is sandwiched between the silicon carrier 801 carrying the 24-core logic chip 501, and an additional carrier 802 for routing purposes. In this package-on-package system 800, integrated decoupling capacitors 803 are located directly underneath each chip or chip stack and are connected using the interconnects. Because of their close proximity to the chip circuits, integrated decoupling capacitors 803 provide decoupling by means of a low inductance path, which provides advantages such as, but not limited to, reduced noise, lower voltage circuit operation, improved voltage distribution (i.e. lower voltage droop), higher frequency operation, and any combination thereof. The lower carrier package 802 can be made from a variety of materials, including ceramics, silicon, and organic materials such as organic packages with build up layers, without build up layers, with fiber reinforcement, without fiber reinforcement.

In one embodiment, power delivery to the chip 501 and chip stacks 502, 503 is provided through the package 802 with the added benefit of integrated decoupling capacitors 803 in some applications, as described above. The present invention provides a significant advantage over the prior art, in terms of power delivery, by keeping the processor 501 separate from the cache chip stack 502, 503, thereby reducing the number of power delivery connections needed through the silicon processor 501 and cache chip stacks 502, 503. This additional area would have previously detracted from the area available in both the processor 501 and cache chip stacks 502, 503 for active circuits and for signal and power wiring.

In terms of cooling, the present invention offers an additional advantage over the prior 3D technology because there are now separate, multiple independent paths for cooling both the processor chip 501 and the cache chip stack 502, 503. Because the processor chip 501 is no longer vertically mounted to the cache stack 502, 503, cooling is provided on both the topsides and the backsides of the processor chip 501 and of the cache stack 502, 503. In addition, the cooling of the chip stack 502, 503 is engineered to utilize vertical thermal interconnections 805 between the cache chips in the cache chip stack 502, 503. The thermal path is comprised of electrical interconnections, thermal vias, thermal spreaders and/or thermal interconnections. In one embodiment, the thermal connections 902 benefit from added Metal vias such as copper vias and metal interconnections between chips in a chip stack. Thermal interconnections include the use of additional mechanical and thermal connections such as added pads, solder connections, thermal interface materials such as filled adhesives or alternate means. Further cooling is enhanced using a wide range of assembled module options such as heat spreaders, heat sinks, heat pipes, heat fins, air cooling, liquid cooling such as but not limited to microchannel cooling or combinations of cooling methods and structures used in the industry at a module level.

Figure 9:
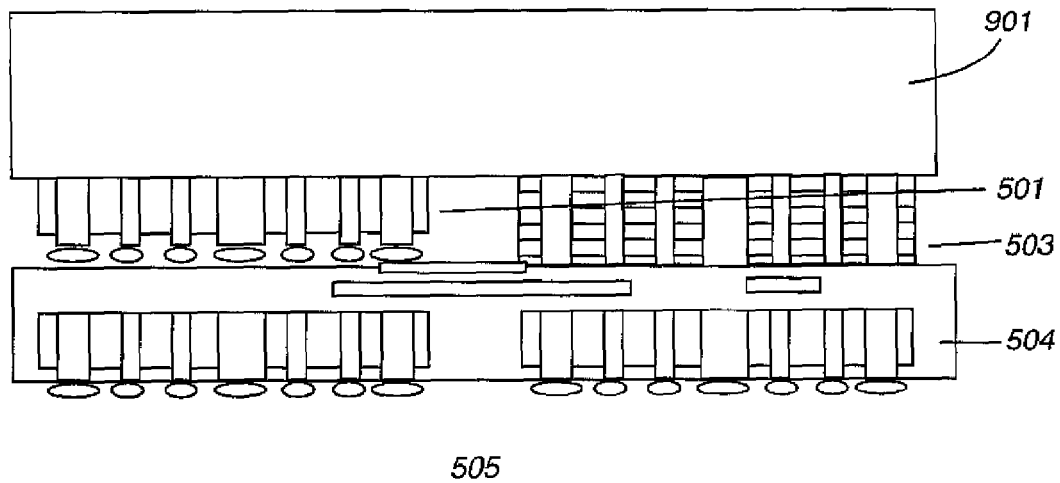
FIG. 9 is a more detailed block diagram of the 24-way single-socket processor system of FIG. 5, illustrating exemplary cooling techniques in accordance with an embodiment of the present invention.
Figure 9:
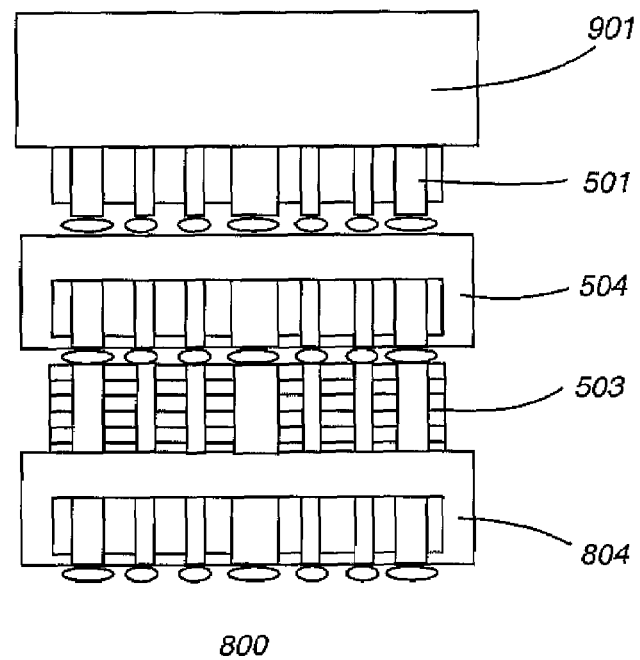

As depicted in one example shown in FIG. 9, there are two independent paths for cooling such as a cooling hat 901 at the topside of the processor chip 501 and another at the bottom of the chip stack 503 by means of a heat sink and thermal connections at the bottom side of the cache stack 503 to the package 504. Note in the case of the heat spreader 802, the spreader would also serve as a package 802 for power, electrical and mechanical integrity.

Another example shows one traditional cooling surface 901 placed at the at top of processor layer 501, and the second carrier package 801 placed at the bottom of the cache stack 503, as shown in FIG. 9. The multiple cooling paths allow for more efficient cooling than can be realized using only 3D technology.

Figure 2:
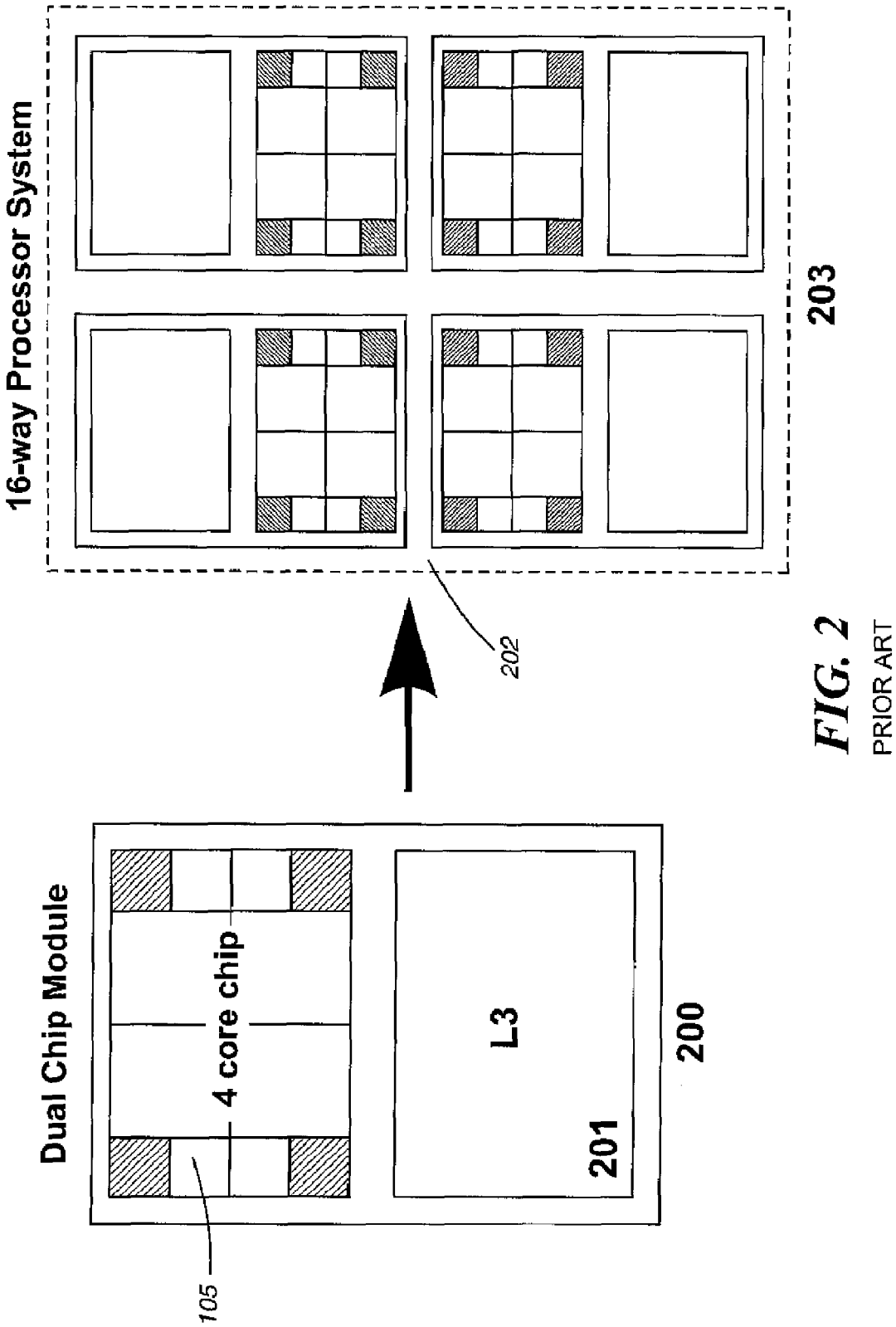
FIG. 2 is a block diagram illustrating a prior art dual-chip module using the multi-core chip of FIG. 1, and a prior art 16-processor system made from dual-chip modules.
Figure 3:
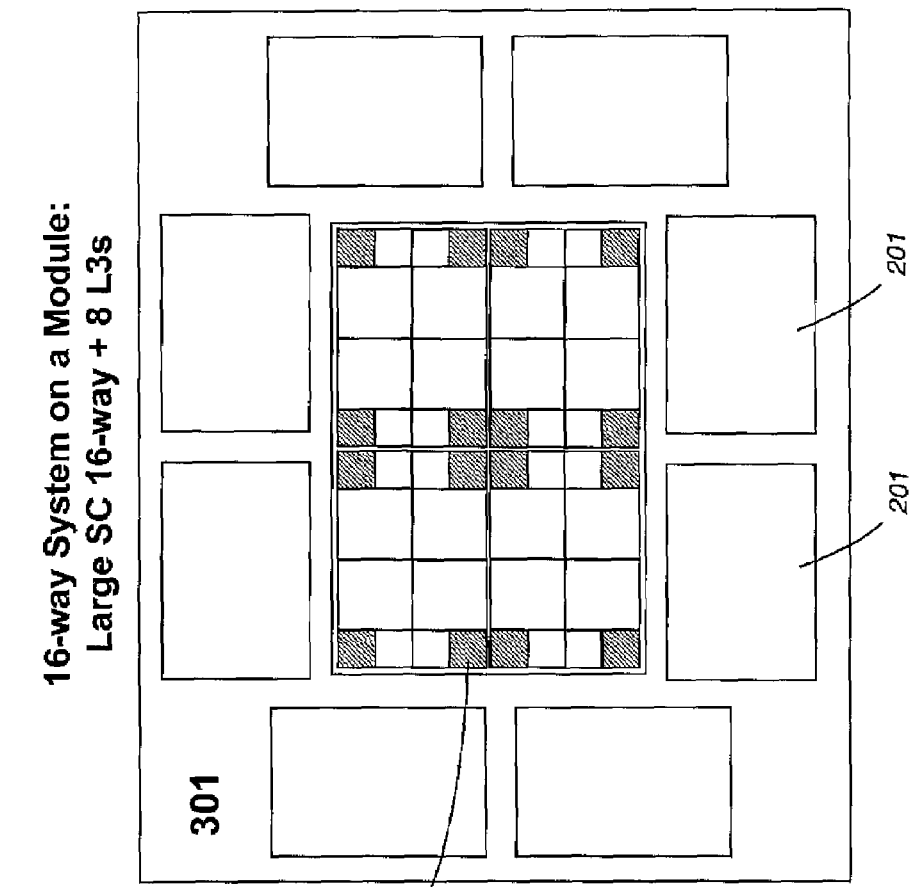
FIG. 3 is a block diagram illustrating a prior art 16-way multi-chip on a Silicon Carrier (SC) and two possible prior-art systems that can be made either with the SC and a second-level package, or with a huge SC alone.
Figure 3:
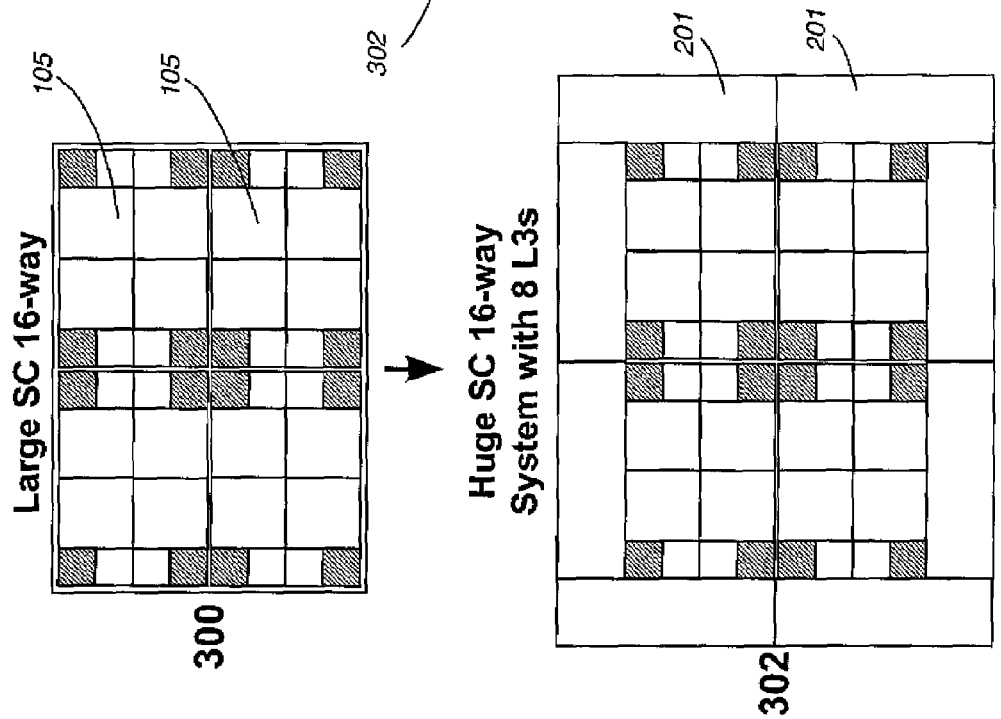
Figure 4:
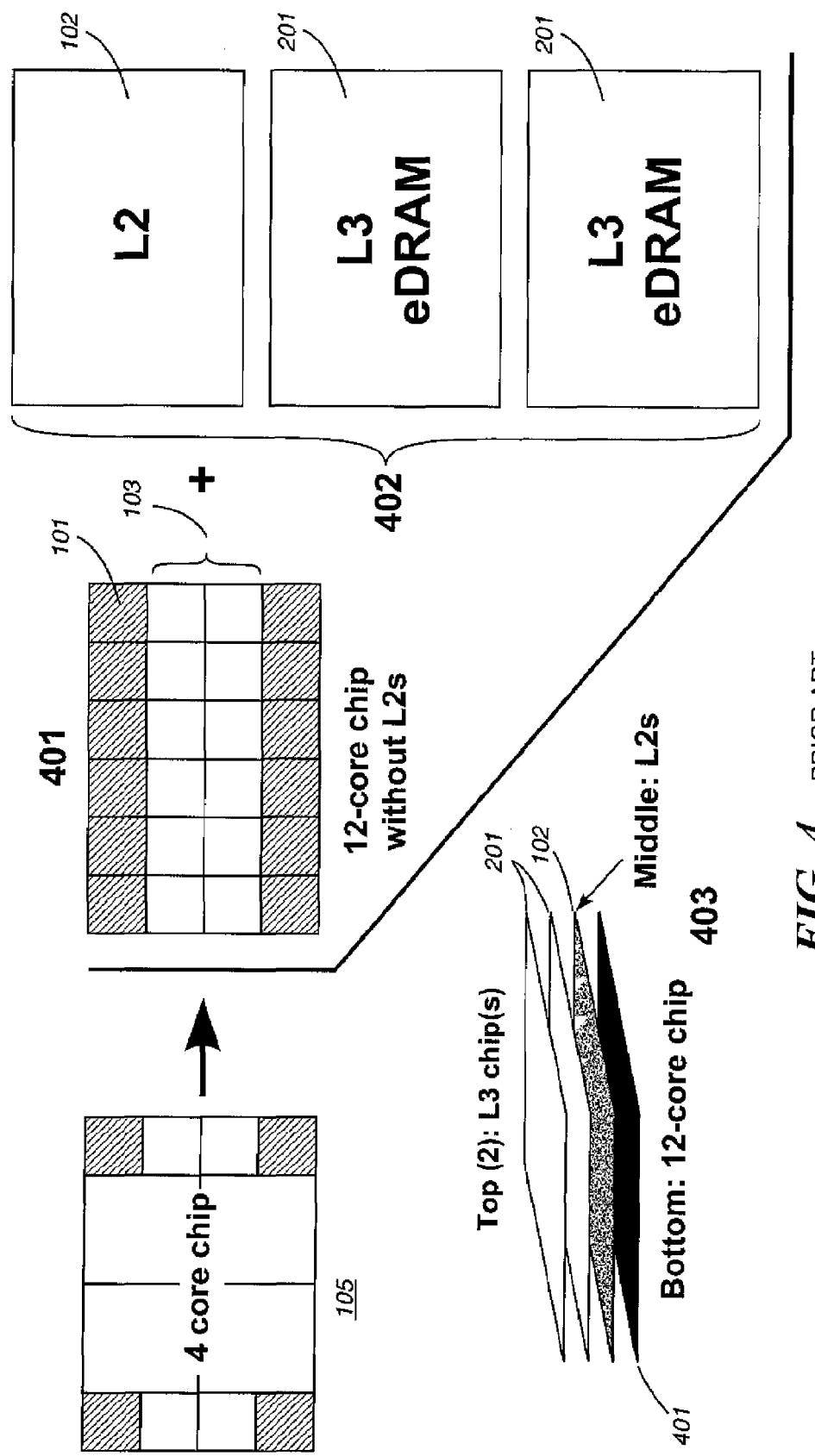
FIG. 4 is a block diagram illustrating a prior art 12-way processor system with a cache hierarchy made on the same footprint of a multi-core chip using 3D technology.

The prior-art subsystems of FIGS. 2 and 3, would have taken a very large, complicated board, or even multiple boards, to implement a 24-way system. In those cases, the complexity level may have limited the system to a maximum 16-way system. By increasing the degree of integration, the present invention enables a simpler physical system. Not only is the new system a higher capacity system (in number of processors), but it is more power efficient because it has much shorter busses; more performance efficient because the busses can be wider; more cost efficient because redundancy in the cores enables lower yield loss; and capable of having a lower power density.

Although the preceding discussion of the features of the present invention highlights applying a combination of SC and 3D techniques to create a larger, more efficient microprocessor, it should be noted that the elements of the present invention are not limited to microprocessor design. It should be obvious to those skilled tin the art that any combination of chip types (e.g. single-layered chips with multi-layered chips; or exclusively multi-layered chips), using both SC and 3D routing techniques, are within the scope of the present invention.

Non-Limiting Hardware and Software Examples

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multi-chip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

A computer system may include, inter alia, one or more computers and at least a computer readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network that allow a computer system to read such computer readable information.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A computer chip structure, comprising:
    at least one single-layered chip, wherein the at least one single-layered chip is a processor that; comprises multiple cores
    at least one multi-layered chip stack; and
    a carrier package characterized by electrical interconnections of less than one hundred (100) microns diameter, wherein the single-layered chip and the multi-layered chip stack are each electrically coupled to the electrical interconnections of the carrier package, and the single-layered chip communicatively coupled to the multi-layered chip stack through the carrier package so that an electrical signal propagates over a given distance between the single-layered chip and the multi-layered chip stack at substantially a speed of propagation for a single layer chip over the given distance, wherein the processor comprises multiple cores.

2. The computer chip structure of claim 1, wherein the at least one multi-layered chip comprises a memory cache stack.

3. The computer chip structure of claim 1, wherein at least one of the single-layered chip and the multi-layered chip stack is electrically coupled to the carrier package by interconnect vias.

4. The computer chip structure of claim 3, wherein the interconnect vias have a density that is as least as great as two thousand five hundred interconnections per square centimeter (2500 interconnections/cm$^2$).

5. The computer chip structure of claim 3, wherein the carrier package further comprises a plurality of integrated decoupling capacitors, each coupling capacitor physically positioned directly under an interconnect via on a side of the carrier package opposite the side the single-layered chip and the multi-layered chip stack are electrically coupled thereto.

6. The computer chip structure of claim 5, wherein
    power is delivered to the single-layered chip by means of integrated decoupling capacitors located directly under an interconnect via of the single-layered chip; and
    power is delivered to the multi-layered chip stack by means of integrated decoupling capacitors located directly under an interconnect via of the multi-layered chip stack.

7. The computer chip architecture of claim 6, wherein the interconnect vias are created by means of at least one of silicon through vias, electrical interconnections, thermal vias, thermal interconnections, and thermal interface materials.

8. The computer chip structure of claim 1, wherein the carrier package comprises at least one of silicon, organic materials with build up layers, organic materials without build up layers, organic materials with fiber reinforcement, and organic materials without fiber reinforcement.

9. The computer chip structure of claim 1, wherein:
    the carrier package comprises a first surface plane and a second surface plane opposing the first surface plane; and
    the single-layered chip and the multi-layered chip stack are physically positioned on the same surface plane of the carrier package.

10. The computer chip structure of claim 9, further comprising:
    a first cooling structure thermally coupled to a top-side of the single-layered chip; and
    a second cooling structure thermally coupled to a bottom-side of the multi-layered chip stack.

11. The computer chip structure of claim 10, further comprising at least two independent thermal paths, wherein each thermal path is created by means of at least one of electrical vias, electrical interconnections, thermal vias, thermal interconnections, and thermal interface materials.

12. The computer chip structure of claim 1, wherein:
    the carrier package comprises a first surface plane and a second surface plane opposing the first surface plane; and
    the single-layered chip and the multi-layered chip stack are physically positioned on opposing surface planes of the carrier package such that horizontal wiring distances in intra-level busses are minimized.

13. The computer chip structure of claim 12, further comprising:
a second carrier package, electrically coupled to at least one multi-layered chip stack by interconnect vias.

14. The computer chip structure of claim 13, wherein the second carrier package further comprises a plurality of integrated coupling capacitors, each coupling capacitor physically positioned directly under an interconnect via on a side of the carrier package opposite the side the single-layered chip and the multi-layered chip stack are electrically coupled thereto.

15. The computer chip structure of claim 14, wherein the second carrier package is thermally coupled to the multi-layered chip stack for providing a second, independent path for heat dissipation.

16. A computer chip structure comprising:
a plurality of multi-layered chip stacks; and
a carrier package characterized by electrical interconnections of less than 100 microns diameter, wherein the multi-layered chip stacks are each electrically coupled to the electrical interconnections of the carrier package, and communicatively coupled to at least one other multi-layered chip stack through the carrier package so that an electrical signal propagates over a given distance between the multi-layered chip stacks at substantially a speed of propagation for a single layer chip over the given distance.

17. The computer chip structure of claim 16, wherein the plurality of multi-layered chip stacks is electrically coupled to the carrier package by interconnect vias.

18. A computer system comprising:
a computer chip structure comprising at least one single-layered chip, at least one multi-layered chip stack, and a carrier package characterized by electrical interconnections of less than 100 microns diameter, wherein the single-layered chip and the multi-layered chip stack are each electrically coupled to the electrical interconnections of the carrier package, and the single-layered chip communicatively coupled to the multi-layered chip stack through the carrier package so that an electrical signal propagates over a given distance between the single-layered chip and the multi-layered chip stack at substantially a speed of propagation for a single layer chip over the given distance; and
a nest, electrically coupled to the computer chip structure, for executing functions of the computer system.

* * * * *